United States Patent [19]

Honda et al.

[11] Patent Number: 5,555,271
[45] Date of Patent: Sep. 10, 1996

[54] SEMICONDUCTOR LASER DEVICE

[75] Inventors: Shoji Honda, Tottori; Masayuki Shono, Moriguchi; Ryoji Hiroyama, Hirakata; Yasuyuki Bessho, Uji; Hiroyuki Kase, Takatsuki; Toyozo Nishida; Takahiro Uetani, both of Hirakata; Junko Suzuki, Nara, all of Japan

[73] Assignee: Sanyo Electric Co., Ltd., Osaka-fu, Japan

[21] Appl. No.: 363,619

[22] Filed: Dec. 23, 1994

[30] Foreign Application Priority Data

Dec. 27, 1993 [JP] Japan ................................. 5-332321
Sep. 14, 1994 [JP] Japan ................................. 6-220212

[51] Int. Cl.$^6$ ........................................................ H01S 3/19
[52] U.S. Cl. .............................. 372/45; 372/43; 372/46; 372/48; 372/50
[58] Field of Search ........................... 372/43, 45, 46, 372/48, 50

[56] References Cited

U.S. PATENT DOCUMENTS

| 4,328,469 | 5/1982 | Scifres et al. ........................... 372/45 |
| 4,438,446 | 3/1984 | Tsang ..................................... 357/17 |
| 5,146,466 | 9/1992 | Hamada et al. ......................... 372/45 |
| 5,253,265 | 10/1993 | Seko et al. ............................ 372/46 |
| 5,408,487 | 4/1995 | Uchida et al. ......................... 372/45 |
| 5,416,790 | 5/1995 | Yodoshi et al. ........................ 372/46 |

FOREIGN PATENT DOCUMENTS

| 60-189986 | 9/1985 | Japan ..................................... 372/45 |
| 62-296582 | 12/1987 | Japan ................................... 372/45 |
| 4-114486 | 4/1992 | Japan ..................................... 372/45 |
| 5-3367 | 1/1993 | Japan ..................................... 372/45 |
| 7-22695 | 1/1995 | Japan ..................................... 372/45 |
| 7-46745 | 5/1995 | Japan ..................................... 372/45 |

Primary Examiner—Brian Healy
Attorney, Agent, or Firm—Darby & Darby, P.C.

[57] ABSTRACT

On an n-type GaAs semiconductor substrate, an n-type cladding layer formed of AlGaInP system crystal almost in lattice matching with the semiconductor substrate, an active layer and a p-type cladding layer formed of AlGaInP system crystal almost in lattice matching with the semiconductor substrate are formed, and a p-type barrier cladding layer formed of AlGaInP system crystal or AlInP system crystal is provided in the p-type cladding layer. The p-type barrier cladding layer has a thickness through which electrons are almost not transmitted, has tensile strain, and also has band gap energy larger than that of the p-type cladding layer.

21 Claims, 7 Drawing Sheets

SEMICONDUCTOR LASER DEVICE

BACKGROUND OF THE INVENTION

1. Field of the Invention

The present invention relates to semiconductor laser devices, and particularly to an improvement in temperature characteristics and threshold current of AlGaInP system semiconductor laser devices.

2. Description of the Background Art

Conventionally, the AlGaInP system semiconductor laser devices have been studied and developed actively as semiconductor laser devices having oscillation wavelength around 630 nm band. Such semiconductor laser devices are used for laser pointers, line markers and the like because the 630 nm band has high spectral luminous efficiency, and they are also expected as light sources for high density optical disc system and the like because they have oscillation wavelength shorter as compared with AlGaAs system semiconductor laser devices.

The semiconductor laser devices are required to have good temperature characteristics such as maximum operating temperature and low threshold current. To improve these characteristics, it is necessary to make large a difference of band GaP energy Eg between an active layer and a p-type cladding layer constituting double hetero structure and also to make high the concentration of the p-type carrier in the p-type cladding layer, that is, to make large the band discontinuity (energy difference) $\Delta Ec$ in a conduction band of the active layer and the p-type cladding layer to make the confinement of electrons good.

In the AlGaInP system semiconductor laser devices, $(Al_xGa_{1-x})_{0.5}In_{0.5}P$ crystals in lattice matching with GaAs semiconductor substrates and having no strain are used as the p-type cladding layers. In the $(Al_xGa_{1-x})_{0.5}In_{0.5}P$ crystals, the band gap energy Eg increases as the Al composition ratio x increases, but the p-type carrier concentration decreases as the Al composition ratio x increases as shown in FIG. 11. FIG. 11 shows the Al composition ratio x dependence of the p-type carrier concentration in the case of growing the $(Al_xGa_{1-x})_{0.5}In_{0.5}P$ crystals using the Metal Organic Chemical Vapor Deposition method (MOCVD method) under the conditions of growth temperature (Tg) 650° C. and the ratio Zn/III=0.6, the ratio of a supplied amount of Zn which is dopant and a supplied amount of III Group atoms, as an example.

As a result, the Al composition ratio x in the p-type cladding layer formed of $(Al_xGa_{1-x})_{0.5}In_{0.5}P$ crystal is selected in the range of 0.5–0.8 to have good confinement of electrons.

However, such AlGaInP system semiconductor laser devices having p-type cladding layers with such Al composition ratio x selected in this way also involve a problem that the temperature characteristics are bad and the threshold current is high because the band discontinuity $\Delta Ec$ in the conduction bands of the active layers and the p-type cladding layers is smaller as compared with the AlGaAs system semiconductor laser devices, for example.

To solve such a problem, it is disclosed in Japanese Patent Laying-Open No. 4-114486 to provide a multiquantum barrier (MQB) composed of alternately provided quantum well layers and quantum barrier layers having thickness which transmits electrons between the active layer and the p-type cladding layer. This multiquantum barrier highly reflects electrons on the basis of the interference of electrons by controlling the thicknesses, periods and the like of the quantum well layers and the quantum barrier layers. In such a multiquantum barrier, it is indispensable to form the quantum well layers and the quantum barrier layers having thickness through which electrons can be transmitted, that is, very small thickness (several atomic layers), so that the interference of electrons occurs, and also it is necessary to set the periods of the quantum well layers and the quantum barrier layers to predetermined values. Accordingly, in forming the multiquantum barrier, the thicknesses of the well layers and barrier layers must be controlled with a high accuracy, resulting in difficult manufacturing.

SUMMARY OF THE INVENTION

An object of the present invention is to provide a semiconductor laser device having good temperature characteristics and low threshold current and which can be manufactured easily.

A semiconductor laser device according to the present invention includes: a GaAs semiconductor substrate of a first conductivity type; a first cladding layer formed on the GaAs semiconductor substrate and formed of AlGaInP system crystal of the first conductivity type which is almost in lattice matching with the GaAs semiconductor substrate; an active layer formed on the first cladding layer; a second cladding layer formed on the active layer and formed of AlGaInP system crystal of a second conductivity type which is opposite to the first conductivity type almost in the lattice matching with the GaAs semiconductor substrate; and a p-type barrier cladding layer provided at least in p-type one of the first and second cladding layers or at least between the p-type cladding layer and the active layer and formed of AlGaInP system crystal or AlInP system crystal; in which the p-type barrier cladding layer has a thickness through which almost no electrons are transmitted, and has tensile strain and also has band gap energy larger than that of the p-type cladding layer.

The thickness of the p-type barrier cladding layer is preferably not less than 200 Å and not more than 500 Å, more preferably not less than 250 Å and not more than 400 Å.

As stated above, the semiconductor laser device according to the present invention includes a p-type barrier cladding layer formed of AlGaInP system crystal or AlInP system crystal having a thickness through which electrons are almost not transmitted (i.e., a thickness which causes almost no quantum effect) and also having tensile strain in addition to the p-type cladding layer formed of AlGaInP system crystal which is almost in lattice matching (i.e., having almost no strain) with the GaAs semiconductor substrate. This p-type barrier cladding layer makes the energy difference larger in a conduction band of the active layer and this p-type barrier cladding layer and also functions as a barrier layer for blocking transmission of the electrons. Accordingly, in addition to the confinement effect of electrons in the active layer by the p-type cladding layer almost in lattice matching with the GaAs semiconductor substrate, the confinement of electrons in the active layer is satisfactorily effected by the p-type barrier cladding layer. As a result, the threshold current is decreased and the temperature characteristics are improved.

Furthermore, as the p-type barrier cladding layer is a part of the p-type cladding layer, element series resistance does not become considerably high even if the p-type carrier concentration in the p-type barrier cladding layer is low.

Also, the thickness of the p-type barrier cladding layer is relatively large and the thickness does not have to be controlled very accurately, so that its manufacturing is easy.

The p-type barrier cladding layer is formed of $(Al_zGa_{1-z})_uIn_{1-u}P$, where preferably $0.7 \leq z \leq 1$ and $0.51 < u < 1$. In this case, the threshold current and the temperature characteristics become good. More preferably, $0.8 \leq z \leq 1$ and $0.51 < u < 1$, and further preferably $0.9 \leq z \leq 1$ and $0.51 < u < 1$. In this case, the threshold current and the temperature characteristics are further improved.

Also, the p-type barrier cladding layer preferably has the strain of not less than $-1.5\%$ and not more than $-0.5\%$, and further preferably has the strain of not less than $-1.2\%$ and not more than $-0.8\%$, and most preferably has the strain of not less than $-1.1\%$ and not more than $-0.9\%$. In this case, the threshold current and the temperature characteristics are further improved.

Furthermore, the GaAs semiconductor substrate preferably has a crystal growth plane misoriented from the {100} plane to the <011> direction by not less than 5 degrees and not more than 17 degrees. In this case, the threshold current and the temperature characteristics are well improved.

The semiconductor laser device according to the present invention may further include an n-type barrier cladding layer provided in n-type one of the first and second cladding layers or between the n-type cladding layer and the active layer and formed of AlGaInP system crystal or AlInP system crystal. The n-type barrier cladding layer has a thickness through which electrons are almost not transmitted, has tensile strain and has band gap energy larger than that of the n-type cladding layer.

The active layer may comprise a quantum well structure layer including quantum barrier layers formed of AlGaInP system crystal and at least one quantum well layer formed of AlGaInP system crystal or GaInP crystal alternately provided. The active layer may further comprise optical guide layers on both sides of the quantum well structure layer. The active layer may comprise a layer formed of AlGaInP system crystal or GaInP system crystal.

A semiconductor laser device according to another aspect of the present invention includes: a GaAs semiconductor substrate of a first conductivity type; a first cladding layer formed on the GaAs semiconductor substrate and formed of AlGaInP system crystal of the first conductivity type which is almost in lattice matching with the GaAs semiconductor substrate; an active layer formed on the first cladding layer; a second cladding layer formed on the active layer and formed of AlGaInP system crystal of a second conductivity type which is opposite to the first conductivity type almost in the lattice matching with the GaAs semiconductor substrate; and a plurality of p-type barrier cladding layers provided separately from each other at least in p-type one of the first and second cladding layers or at least between the p-type cladding layer and the active layer and formed of AlGaInP system crystal or AlInP system crystal; in which each of the plurality of p-type barrier cladding layers has a thickness through which almost no electrons are transmitted, and has tensile strain and also has band gap energy larger then that of the p-type cladding layer.

Preferably, the plurality of p-type barrier cladding layers have refractive index which gradually decreases with distance from the active layer. This makes optical confinement in the active layer good and further improves the temperature characteristics.

The semiconductor laser device may further include a plurality of n-type barrier cladding layers provided separately from each other in n-type one of the first and second cladding layers or between the n-type cladding layer and the active layer and formed of AlGaInP system crystal or AlInP system crystal. Each of the plurality of n-type barrier cladding layers has a thickness through which electrons are almost not transmitted, has tensile strain and has band gap energy larger than that of the n-type cladding layer. Preferably, the plurality of n-type barrier cladding layers have refractive index which gradually decreases as being separated from the active layer.

Further preferably, the plurality of p-type and n-type barrier cladding layers have refractive index symmetry about the active layer. This makes the optical confinement in the active layer further better and further improves the temperature characteristics.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (1) First Embodiment

Figure 1:
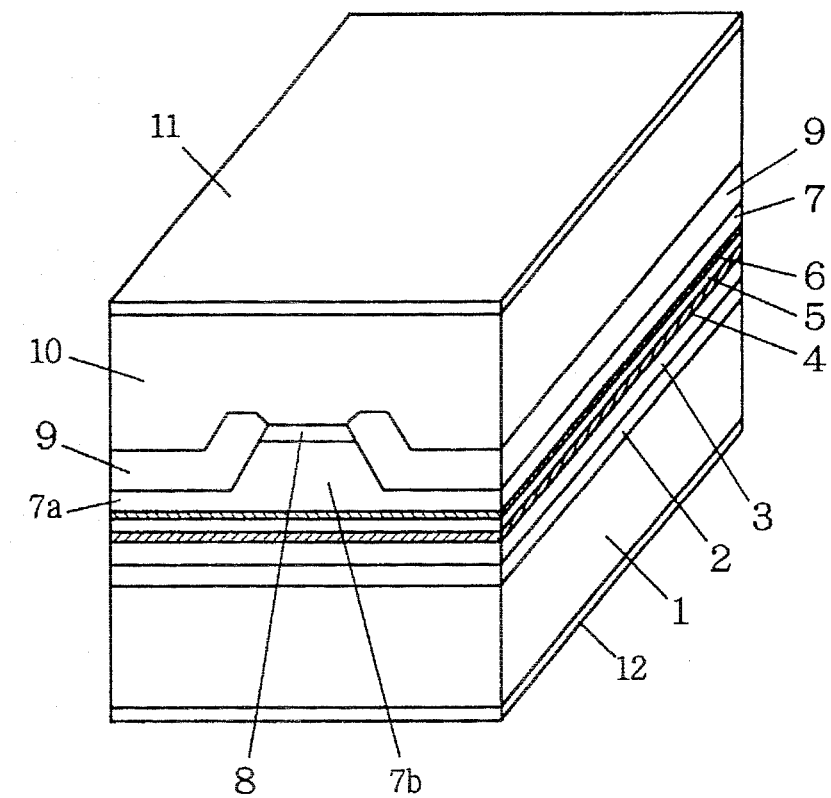
FIG. 1 is a schematic perspective view of a semiconductor laser device according to the first embodiment of the present invention.
Figure 2:
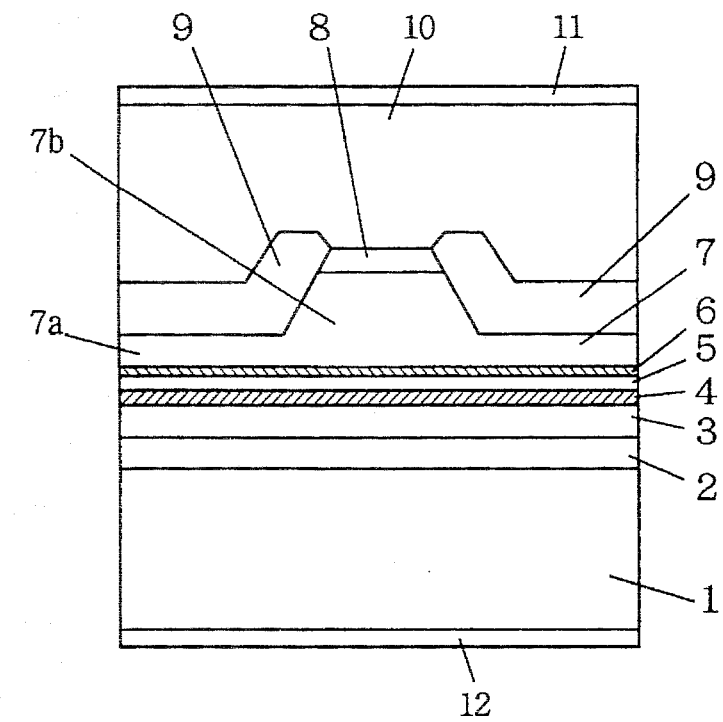
FIG. 2 is a schematic sectional structure diagram of the semiconductor laser device according to the first embodiment.
Figure 3:
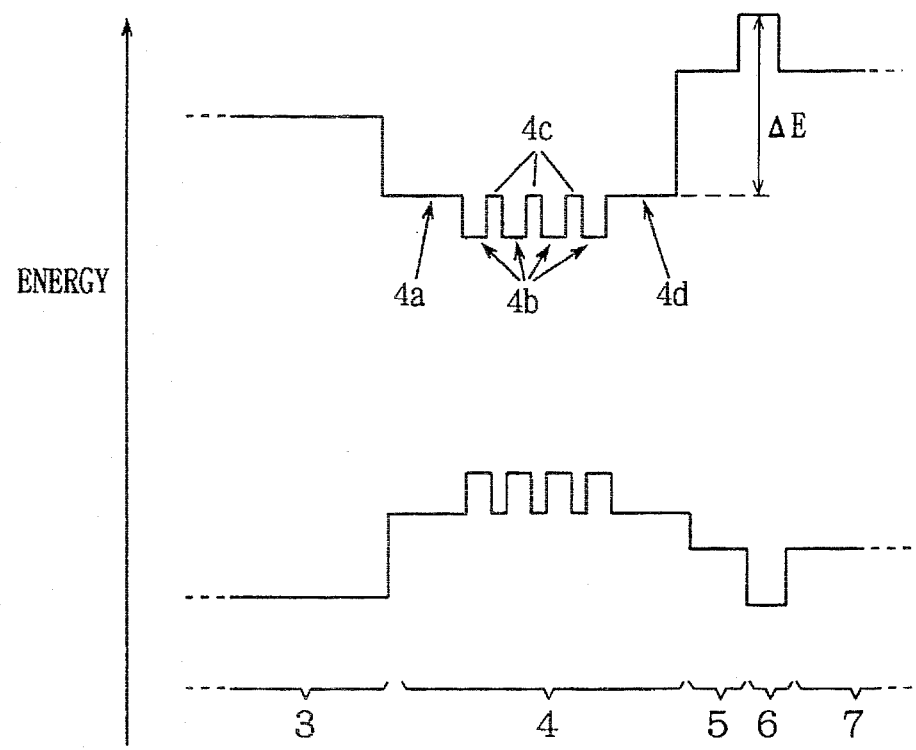
FIG. 3 is a schematic band structure diagram of the active layer and vicinity of the semiconductor laser device according to the first embodiment.

An AlGaInP system semiconductor laser device according to the first embodiment of the present invention will now be described. FIG. 1, FIG. 2 and FIG. 3 are a schematic perspective view, a schematic sectional structure diagram and a schematic band structure diagram of an active layer and vicinity, respectively, of a semiconductor laser device according to the first embodiment.

In the figures, an n-type GaAs semiconductor substrate 1 has one main surface (a crystal growth plane) misoriented by an angle θ from the (100) plane to the [011] direction. The angle θ is referred to as a misoriented angle, hereinafter. The misoriented angle θ is preferably 5 degrees to 17 degrees, and further preferably 7 degrees to 13 degrees. On the one main surface of the n-type GaAs semiconductor substrate 1, an n-type $Ga_{0.5}In_{0.5}P$ buffer layer 2 having a thickness of 0.3 μm and an n-type $(Al_{xa}Ga_{1-xa})_{0.5}In_{0.5}P$ cladding layer 3 having a thickness of 0.8–0.9 μm are provided in this order. Now, xa>ya; yb>p≧0, and xa =0.7 in this embodiment.

Provided on the n-type cladding layer 3 is an active layer 4 having the structure shown in FIG. 3. The active layer 4 has undoped tensile strain multiquantum well structure (tensile strain MQW structure) interposed between an undoped $(Al_{ya}Ga_{1-ya})_{0.5}In_{0.5}P$ optical guide layer 4a with a thickness of 500 Å and an undoped $(Al_{yb}Ga_{1-yb})_{0.5}In_{0.5}P$ optical guide layer 4d with a thickness of 500 Å. Now, ya≧r, and ya=0.5 in this embodiment. Also, yb≧r, and yb=0.5 in this embodiment.

The tensile strain MQW structure is formed of a plurality of $(Al_pGa_{1-p})_qIn_{1-q}P$ quantum well layers 4b with a thickness 75 Å having the tensile strain and a plurality of $(Al_rGa_{1-r})_{0.5}In_{0.5}P$ quantum barrier layers 4c of a thickness 40 Å alternately provided. Now, p≧0 and q>0.51, and p=0 and q=0.58 in this embodiment. Also, xa; xb; xc>r>p, and r=0.5 in this embodiment. The number of the tensile strain quantum well layers 4b is typically 6 or less, and it is 4 in this embodiment. The number of the quantum barrier layers 4c is typically 5 or less, and it is 3 in this embodiment. Now, the strain $\Delta a/a_o$ of the tensile strain quantum well layer 4b is —0.5% in this embodiment. Here, Δa = lattice constant a of strain layer—lattice constant $a_o$ of GaAs semiconductor substrate.

Provided on the active layer 4 is a p-type $(Al_{xb}Ga_{1-xb})_{0.5}In_{0.5}P$ cladding layer 5 with a thickness 300 Å. Here, xb>ya; yb>p≧0, and xb=0.7 in this embodiment.

Provided on the p-type cladding layer 5 is a p-type $(Al_zGa_{1-z})_uIn_{1-u}P$ cladding layer (referred to as a p-type barrier cladding layer, hereinafter) 6 having tensile strain. Here, u>0.51 and z>ya; yb>p≧0, and z=0.7, u=0.7, and strain=—1.4% in this embodiment. The p-type barrier cladding layer 6 is set to a thickness through which electrons are almost not transmitted, and preferably to a thickness through which no electron is transmitted at all, and the thickness of the p-type barrier cladding layer 6 is 250 Å in this embodiment.

Provided on the p-type barrier cladding layer 6 is a p-type $(Al_{xc}Ga_{1-xc})_{0.5}In_{0.5}P$ cladding layer 7. Here, xc>ya; yb>p≧0, and xc=0.7 in this embodiment. This p-type cladding layer 7 is comprised of flat portion 7a with a thickness 0.2–0.3 μm, and a ridge-shaped stripe portion 7b of a thickness 0.7 μm extending in the resonator direction (the direction perpendicular to the paper of FIG. 2). The width of the top portion of the ridge portion 7b is 3.5 μm and the width of the bottom portion is 5 μm.

A p-type $Ga_{0.5}In_{0.5}P$ contact layer 8 with a thickness 0.1 μm is formed on the top surface of the ridge portion 7b, and n-type GaAs current blocking layers 9, 9 with a thickness 1 μm are formed on the side surfaces of the contact layer 8 and on the p-type cladding layer 7. A p-type GaAs cap layer 10 with a thickness 2–6 μm is formed on the contact layer 8 and the current blocking layers 9, 9.

Formed on the upper surface of the cap layer 10 is a p-type ohmic electrode 11 formed of Au-Cr, and formed on the lower surface of the n-type GaAs substrate 1 is an n-type ohmic electrode 12 formed of Au—Sn—Cr.

Table 1 shows the threshold current (mA) and the maximum operating temperature (°C.) in the semiconductor laser device of the present embodiment and a semiconductor laser device of a comparison example (a conventional example). The semiconductor laser device of the comparison example has the same structure as that of the semiconductor laser device of the present embodiment except that the p-type barrier cladding layer 6 having tensile strain is not provided therein. The threshold current and maximum operating temperature in Table 1 were measured under the conditions of cavity length 400 μm, and facet uncoating, and continuous oscillation (CW).

TABLE 1

|  | Threshold current [mA] | Maximum operating temperature [°C.] |
|---|---|---|
| This embodiment | 50 | 80 |
| Comparison example | 80 | 40 |

As shown in Table 1, in this embodiment, the threshold current is 50 mA, which is much smaller than 80 mA in the comparison example, and the maximum operating temperature is 80° C., which is higher than 40° C. in the comparison example, from which it is seen that both characteristics have been improved considerably in this embodiment as compared with the comparison example.

Figure 4:
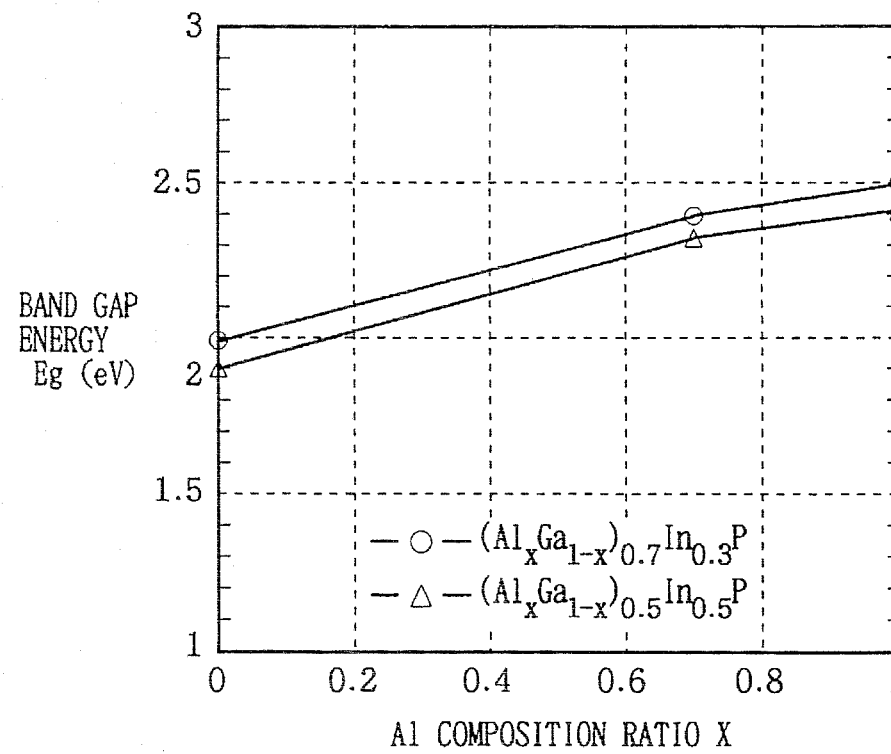
FIG. 4 is a diagram showing the relation between the Al composition ratio and the band gap energy in the $(Al_xGa_{1-x})_{0.5}In_{0.5}P$ crystal and the $(Al_xGa_{1-x})_{0.7}In_{0.3}P$ crystal.

FIG. 4 shows the relation between the Al composition ratio x and the band gap energy Eg in the $(Al_xGa_{1-x})_{0.5}In_{0.5}P$ crystal with no strain used as the cladding layers 3, 5, 7 and the $(Al_xGa_{1-x})_{0.7}In_{0.3}P$ crystal with tensile strain used as the p-type barrier cladding layer 6 in this embodiment. The $(Al_xGa_{1-x})_{0.5}In_{0.5}P$ crystal with no strain is in lattice matching with the GaAs semiconductor substrate 1.

It is seen from FIG. 4 that the band gap energy Eg of the $(Al_xGa_{1-x})_{0.7}In_{0.3}P$ crystal is larger than the band gap energy Eg of the $(Al_xGa_{1-x})_{0.5}In_{0.5}P$ crystal. This relation can be applied not only to the case of composition ratio of $(Al_xGa_{1-x})$ 0.5 and 0.7, and if the Al composition ratio x is the same, the band gap energy Eg of the $(Al_xGa_{1-x})_uIn_{1-u}P$ (u>0.51) crystal is larger than that of the $(Al_xGa_{1-x})_{0.5}In_{0.5}P$, where it becomes the largest when x=1. The band gap energy Eg bends at the Al composition ratio x of about 0.7 because the crystals change from direct transition type semiconductor to indirect transition type semiconductor at this point.

As can be seen from FIG. 3, in the active layer 4, the quantum well structure is interposed between the optical guide layers 4a and 4d having band gap energy equal to (or may be larger than) that of the quantum barrier layer 4c. Furthermore, the active layer 4 is interposed by the cladding layers 3, 5, 7 having band gap energy larger than that of the active layer 4. Furthermore, the p-type barrier cladding layer 6 having tensile strain and a thickness allowing almost no transmission of electrons and having band gap energy larger than that of the p-type cladding layers 5, 7 is provided between the p-type cladding layers 5, 7, that is, in the p-type cladding layer with no strain. As a result, the energy difference ΔEc of the conduction band of the active layer 4 and the p-type barrier cladding layer 6 increases so that electrons can not go over the energy barrier of the p-type barrier cladding layer 6 almost at all, and almost no electrons are transmitted through the p-type barrier cladding layer 6. Accordingly, the confinement of electrons in the active layer 4 is sufficiently accomplished, and therefore the threshold current and the temperature characteristics such as the maximum operating temperature as described above are improved.

(2) Second Embodiment

Figure 5:
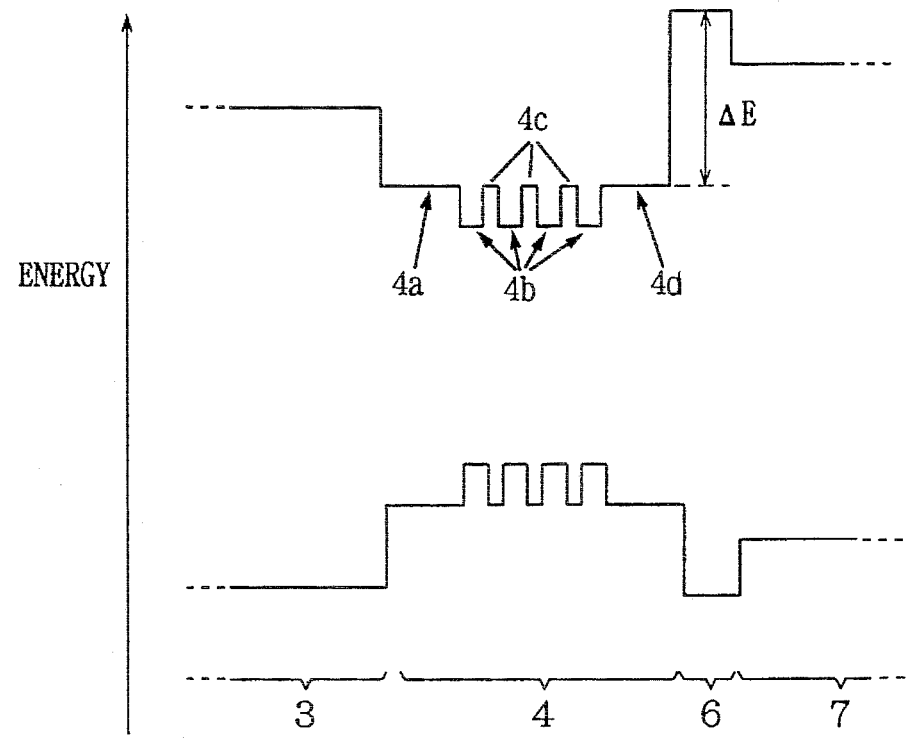
FIG. 5 is a schematic band structure diagram of an active layer and vicinity of a semiconductor laser device according to the second embodiment of the present invention.

Next, an AlGaInP system semiconductor laser device according to the second embodiment of the present invention will be described. The semiconductor laser device of the second embodiment is different from the semiconductor laser device of the first embodiment in that a p-type barrier cladding layer is not provided in a p-type cladding layer with no strain but is provided between a p-type cladding layer with no strain and an active layer. FIG. 5 is a schematic band structure diagram of the active layer and vicinity of the semiconductor laser device of the second embodiment. In FIG. 5, the same reference characters indicate parts the same as or corresponding to those in the first embodiment, and descriptions thereof are not repeated.

In FIG. 5, on the n-type cladding layer 3, the active layer 4 having tensile strain MQW structure, the p-type $(Al_zGa_{1-z})_uIn_{1-u}P$ cladding layer (p-type barrier cladding layer) 6 having tensile strain and having a thickness allowing almost no transmission of electrons, and the p-type cladding layer 7 are formed in this order. Here, $u > 0.51$ and $z > ya$; $yb > p \geq 0$, and $z = 0.7$ and $u = 0.7$ in this embodiment.

That is to say, in this embodiment, the p-type cladding layer 5 shown in FIG. 3 is omitted and the p-type barrier cladding layer 6 is inserted between the active layer 4 and the p-type cladding layer 7.

In the semiconductor laser device according to this embodiment, the p-type barrier cladding layer 6 also has band gap larger as compared with the p-type cladding layer 7 with no strain and does not transmit electrons almost at all, resulting in sufficient confinement of electrons in the active layer 4 as in the first embodiment. Accordingly, threshold current and temperature characteristics such as maximum operating temperature are improved.

(3) Third Embodiment

Next, an AlGaInP system semiconductor laser device according to the third embodiment of the present invention will now be described. The semiconductor laser device of the third embodiment is different from the semiconductor laser device of the first embodiment in that a plurality of p-type barrier cladding layers and a plurality of n-type barrier cladding layers are provided in a p-type cladding layer with no strain and an n-type cladding layer with no strain, respectively, and that the active layer is formed of single quantum well structure. Each p-type barrier cladding layer and each n-type barrier cladding layer has tensile strain, has a thickness allowing almost no transmission of electrons, and also has band gap larger than those of the p-type and n-type cladding layers with no strain.

Figure 6:
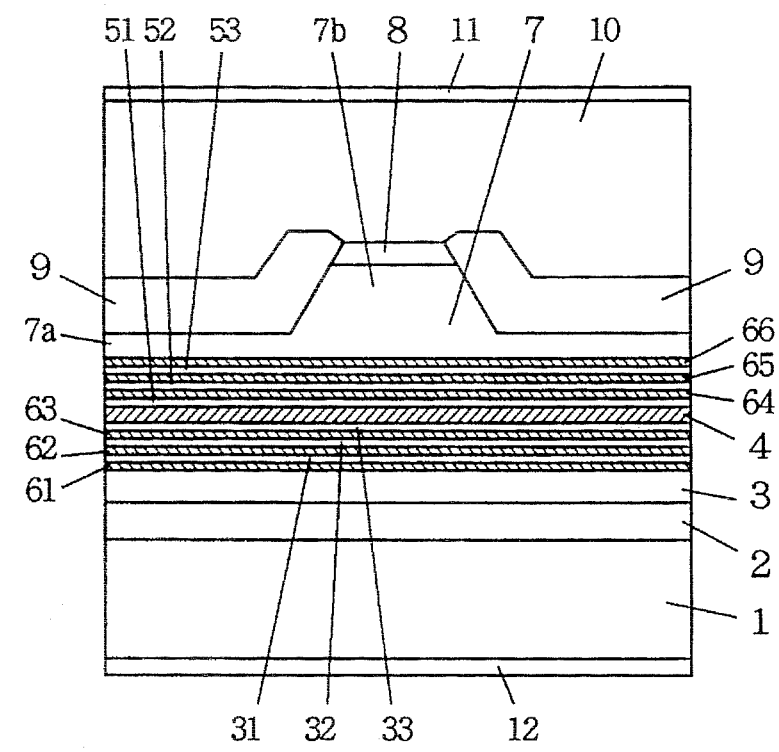
FIG. 6 is a schematic sectional structure diagram of a semiconductor laser device according to the third embodiment of the present invention.
Figure 7:
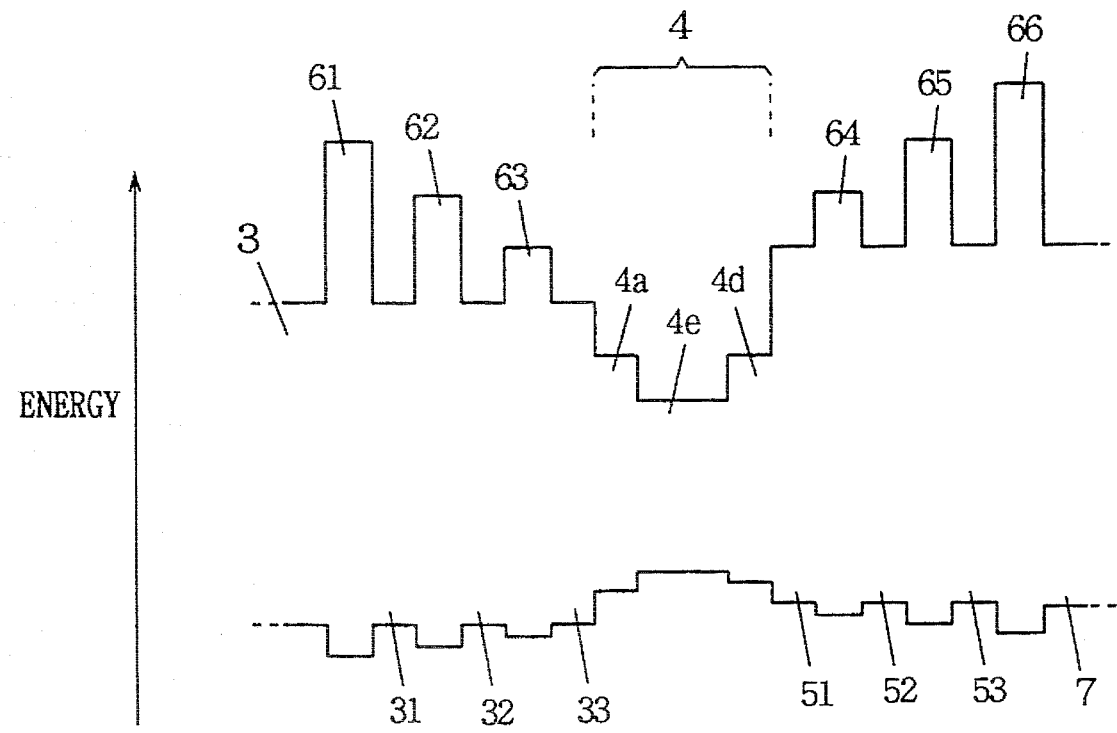
FIG. 7 is a schematic energy band structure diagram of the active layer and vicinity of the semiconductor laser device according to the third embodiment.
Figure 8:
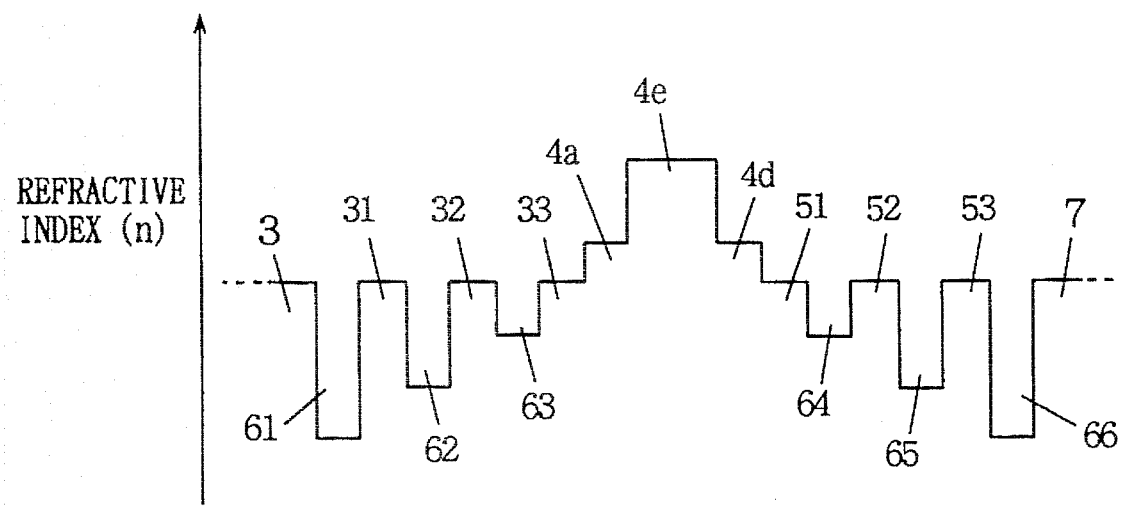
FIG. 8 is a diagram schematically showing the refractive index distribution of the active layer and vicinity of the semiconductor laser device according to the third embodiment.

FIG. 6 is a schematic sectional structure diagram of the semiconductor laser device of the third embodiment, and FIG. 7 and FIG. 8 are a schematic band structure diagram and a schematic refractive index distribution diagram of the active layer and vicinity of the semiconductor laser device, respectively. In FIGS. 6–8, the same or corresponding portions as those in the first embodiment are assigned with the same reference characters and descriptions thereof are not repeated.

Provided on the n-type $Ga_{0.5}In_{0.5}P$ buffer layer 2 is an n-type $(Al_{xa}Ga_{1-xa})_{0.5}In_{0.5}P$ cladding layer 3 having a thickness of 0.7–0.8 μm. Here, $xa > ya$; $yb > pp \geq 0$, and $xa = 0.7$ in this embodiment.

On the n-type cladding layer 3, an n-type $(Al_{z1}Ga_{1-z1})_{u1}In_{1-u1}P$ cladding layer (n-type barrier cladding layer) 61 having tensile strain and a thickness 200 Å, an n-type $(Al_{x1}Ga_{1-x1})_{0.5}In_{0.5}P$ cladding layer 31 with a thickness 200 Å, an n-type $(Al_{z2}Ga_{1-z2})_{u2}In_{1-u2}2P$ cladding layer (n-type barrier cladding layer) 62 having tensile strain and a thickness 200 Å, an n-type $(Al_{x2}Ga_{1-x2})_{0.5}In_{0.5}P$ cladding layer 32 with a thickness 200 Å, an n-type $(Al_{z3}Ga_{1-z3})_{u3}In_{1-u3}P$ cladding layer (n-type barrier cladding layer) 63 having tensile strain and a thickness of 250 Å and an n-type $(Al_{x3}Ga_{1-x3})_{0.5}In_{0.5}P$ cladding layer 33 of a thickness 200 Å are formed in this order.

Now, $u1 > u2 > u3 > 0.51$, and $u1 = 0.75$, $u2 = 0.7$, $u3 = 0.6$ in this embodiment. Also, $x1$; $x2$; $x3 > ya$; $yb > pp \geq 0$, and $x1 = x2 = x3 = 0.7$ in this embodiment. Moreover, $z1$; $z2$; $z3 > ya$; $yb > pp \geq 0$, and $z1 = z2 = z3 = 0.7$ in this embodiment.

The active layer 4 is formed on the n-type cladding layer 33. The active layer 4 is comprised of an undoped $(Al_{ya}Ga_{1-ya})_{0.5}In_{0.5}P$ optical guide layer 4a with a thickness 500 Å, an undoped $(Al_{pp}Ga_{1-pp})_{qq}In_{1-qq}P$ single quantum well layer 4e having tensile strain and a thickness 250 Å and an undoped $(Al_{yb}Ga_{1-yb})_{0.5}In_{0.5}P$ optical guide layer 4d of a thickness 500 Å stacked in this order. Here, $ya$; $yb > pp$ and $qq > 0.51$, and $ya = yb = 0.5$, $pp = 0$, $qq = 0.7$ and $\Delta a/a_o = -1.4\%$ in this embodiment.

On the active layer 4, a p-type $(Al_{x4}Ga_{1-x4})_{0.5}In_{0.5}P$ cladding layer 51 with a thickness 200 Å, a p-type $(Al_{z4}Ga_{1-z4})_{u4}In_{1-u4}P$ cladding layer 64 (p-type barrier cladding layer) having tensile strain and a thickness 250 Å, a p-type $(Al_{x5}Ga_{1-x5})_{0.5}In_{0.5}P$ cladding layer 52 with a thickness 200 Å, a p-type $(Al_{z5}Ga_{1-z5})_{u5}In_{1-u5}P$ cladding layer (p-type barrier cladding layer) 65 having tensile strain and a thickness of 200 Å, a p-type $(Al_{x6}Ga_{1-x6})_{0.5}In_{0.5}P$ cladding layer 53 with a thickness 200 Å, and a p-type $(Al_{z6}Ga_{1-z6})_{u6}In_{1-u6}P$ cladding layer (p-type barrier cladding layer) 66 having tensile strain and a thickness 200 Å are formed in this order.

Here, $u6 > u5 > u4 > 0.51$, and $u4 = 0.6$, $u5 = 0.7$, $u6 = 0.75$ in this embodiment. Also, $x4$; $x5$; $x6 > ya$; $yb > pp \geq 0$, and $x4 = x5 = x6 = 0.7$ in this embodiment. Furthermore, $z4$; $z5$; $z6 > ya$, $yb > p \geq 0$, and $z4 = z5 = z6 = 0.7$ in this embodiment.

When an active layer of the single quantum well structure is used, it is effective in decreasing the threshold current but it may deteriorate the temperature characteristics such as the maximum operating temperature. In this case, the threshold current can be decreased and the temperature characteristics can be improved by providing a p-type barrier cladding layer in a p-type cladding layer with no strain or between a p-type cladding layer with no strain and an active layer as in the first and second embodiments, but providing a plurality of barrier cladding layers and setting the refractive index distribution of the plurality of barrier cladding layers to be substantially cone-shaped with the active layer 4 being an apex, preferably to be symmetric with respect to the active layer 4 as in this embodiment can make the optical confinement in the active layer 4 better to further improve the temperature characteristics.

(4) The Fourth Embodiment

Next, an AlGaInP system semiconductor laser device according to the fourth embodiment of the present invention will now be described. The semiconductor laser device of the fourth embodiment is different from the semiconductor laser device of the first embodiment in that the composition ratio z or the composition ratio u (strain) of the p-type $(Al_zGa_{1-z})_uIn_{1-u}P$ cladding layer (p-type barrier cladding layer) 6 are respectively different and that the thickness of the p-type barrier cladding layer 6 is 300 Å. Other structure of the semiconductor laser device of the fourth embodiment is the same as that of the semiconductor laser device of the first embodiment.

Figure 9:
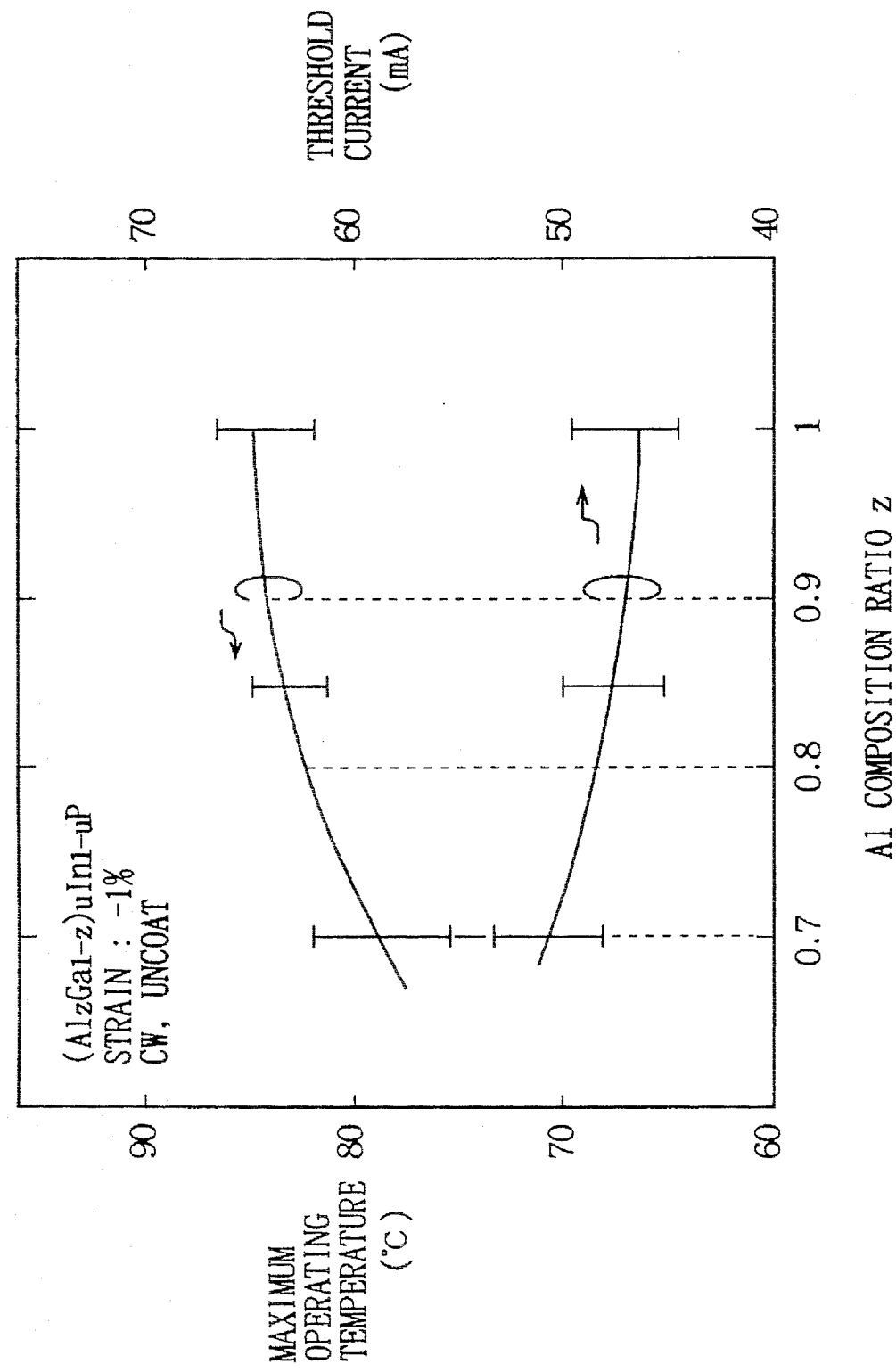
FIG. 9 is a diagram showing the relation of the maximum operating temperature and the threshold current, and the Al composition ratio of a p-type cladding layer in a semiconductor laser device according to the fourth embodiment.

FIG. 9 shows the relation of the maximum operating temperature Tmax (°C.) and the threshold current (mA), and the Al composition ratio z of the p-type barrier cladding layer 6 in the semiconductor laser device of the fourth embodiment. The values in FIG. 9 were measured in the continuous oscillation (CW) about a plurality of semiconductor laser devices with different Al composition ratios z under the conditions of strain quantity of the p-type barrier cladding layer 6 being −1%, facet uncoating and cavity length 400 μm.

From FIG. 9, it is seen that in the range where the composition ratio z of the p-type barrier cladding layer 6 is 0.7 or above and less than or equal to 1, the maximum operating temperature is very high, about 80° C. or above and also the threshold current becomes considerably lower, which is about 50 mA or below, as compared with the comparison example shown in Table 1. In addition, it is also seen that the maximum operating temperature and the threshold current are improved more as the composition ratio z approaches 1. From the results in FIG. 9, the composition ratio z of the p-type barrier cladding layer 6 is more preferably not less than 0.8 and not more than 1, and further preferably not less than 0.9 and not more than 1, and it is most preferably about 1.

Figure 10:
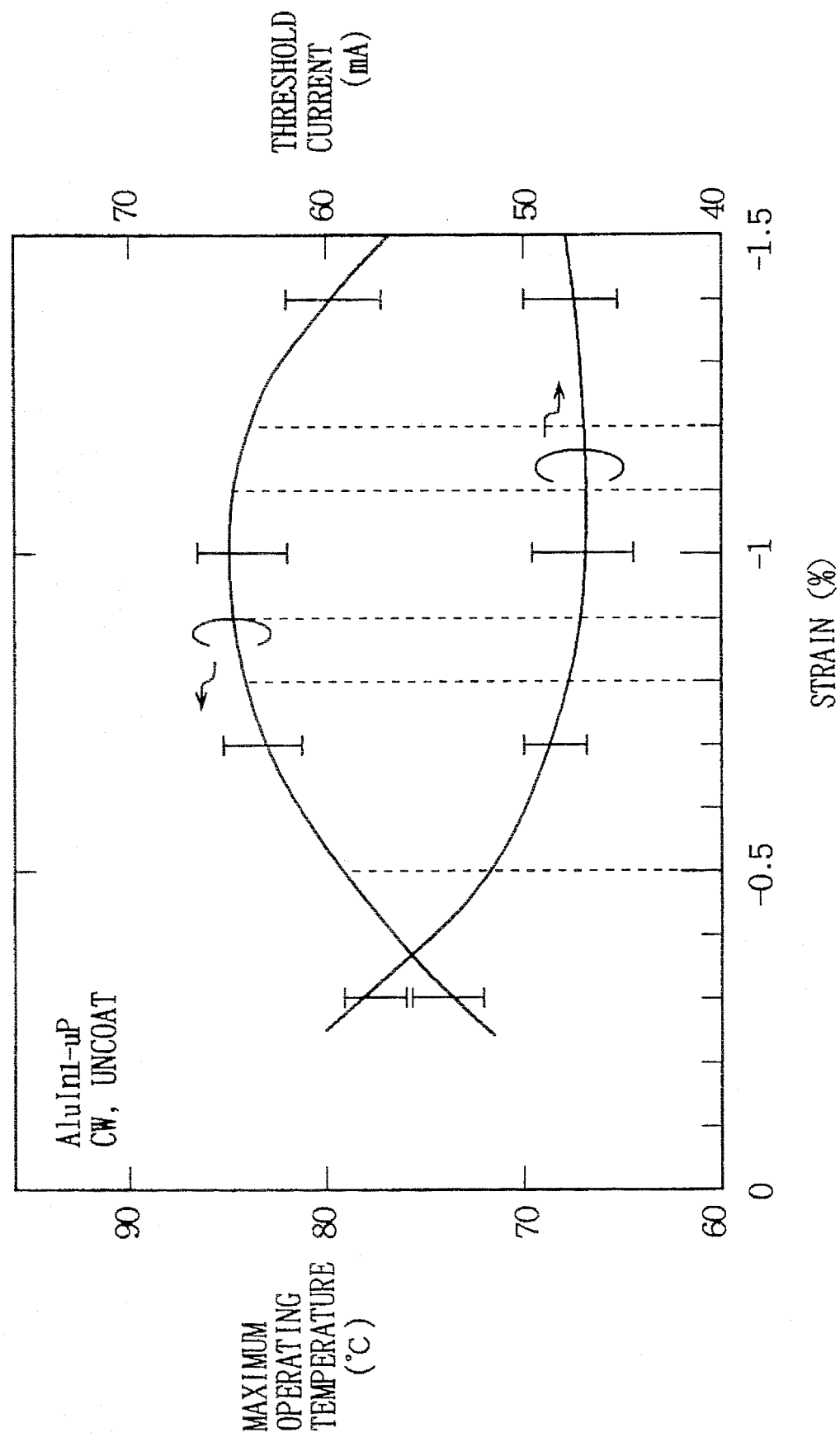
FIG. 10 is a diagram showing the relation of the maximum operating temperature and the threshold current, and the strain of the p-type cladding layer in the semiconductor laser device according to the fourth embodiment.
Figure 11:
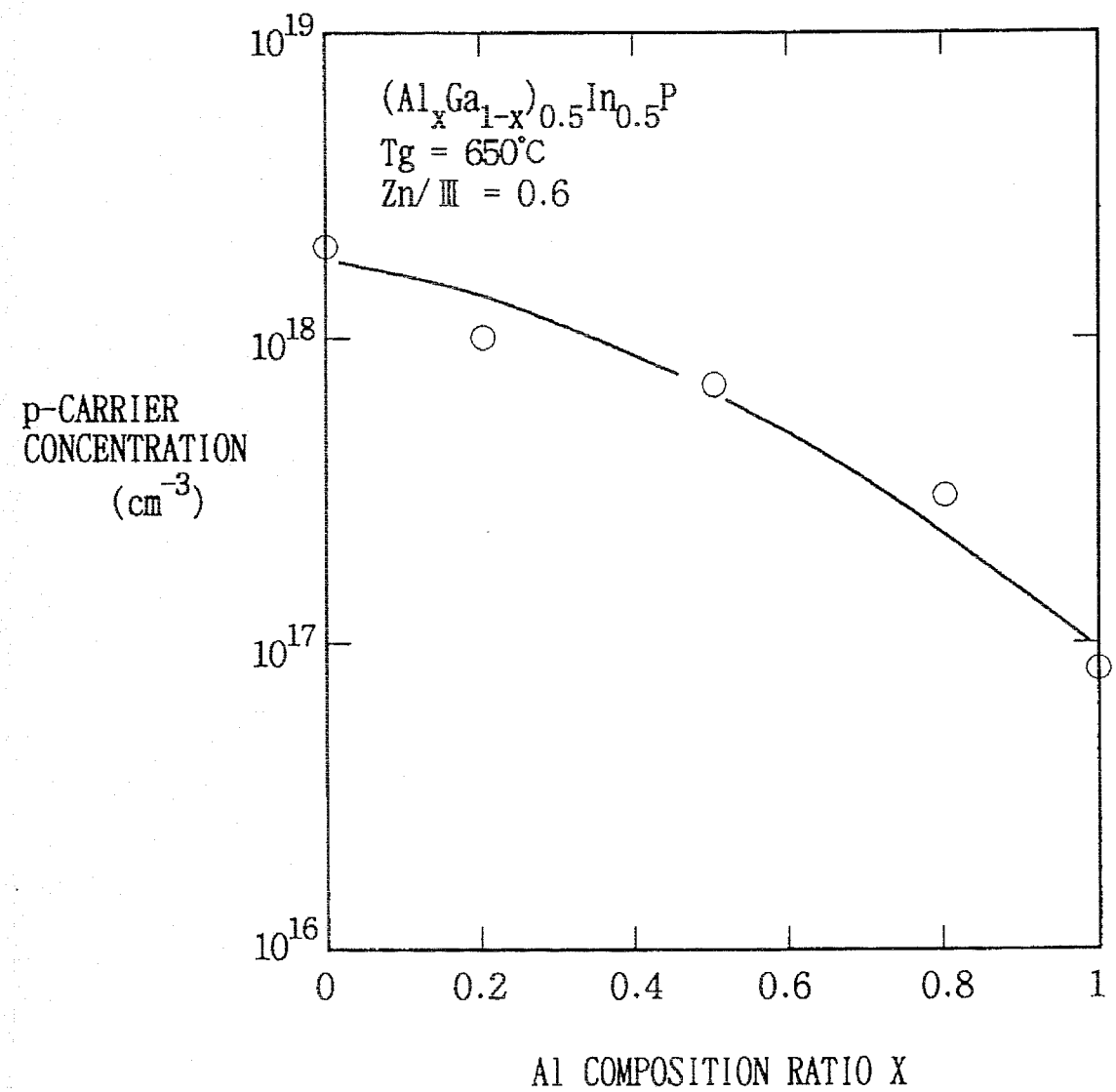
FIG. 11 is a diagram showing the relation between the Al composition ratio and the p-type carrier concentration in the $(Al_xGa_{1-x})_{0.5}In_{0.5}P$ crystal.

In FIG. 10, the relation of the maximum operating temperature Tmax (°C.) and the threshold current (mA), and the strain (%) of the p-type barrier cladding layer 6 in the semiconductor laser device of the fourth embodiment is shown. The values in FIG. 10 were measured in the continuous oscillation (CW) about a plurality of semiconductor laser devices with different quantities of strain of the p-type barrier cladding layers 6 under the conditions of the composition ratio z of the p-type barrier cladding layer 6 being 1, facet uncoating and the cavity length of 400 μm.

It is seen from FIG. 10 that in the range of the strain of the p-type barrier cladding layer being −1.5% (u=0.71) or above and −0.5% (u=0.58) or below, the maximum operating temperature is much higher and the threshold current becomes considerably lower as compared with the comparison example shown in Table 1. In addition, it is also seen that the maximum operating temperature and the threshold current are improved more as the strain approaches about −1% (u=0.65). From the results in FIG. 10, the strain of the p-type barrier cladding layer 6 is more preferably not less than −1.2% (u=0.67) and not more than −0.8% (u=0.62), and further preferably not less than −1.1% (u=0.66) and not more than 0.9% (u=0.63), and most preferably it is about −1%.

(5) Other Modified Examples

Although active layers of the quantum well structure with tensile strain are used in the semiconductor laser devices of the first through fourth embodiments described above, an active layer having compressive strain may be used, or an active layer with no strain may be used, or an active layer of the quantum well structure of strain compensation type with quantum well layers and quantum barrier layers having strains opposite to each other may be used, or a normal active layer having no quantum effect may be used.

Also, though optical guide layers are provided in the active layer to improve optical confinement in the quantum well layer in the semiconductor laser devices of the first through fourth embodiments described above, the optical guide layers do not necessarily have to be provided in the active layer. In the case where no undoped optical guide layer is provided, however, it is preferred that layers adjacent to the active layer other than the barrier cladding layer are undoped to prevent diffusion of impurities into the active layer.

Furthermore, an n-type GaAs buffer layer may be used in place of the n-type $Ga_{0.5}In_{0.5}P$ buffer layer 2 provided between the n-type GaAs semiconductor substrate 1 and the n-type cladding layer 3, or a buffer layer does not necessarily have to be provided. Further, an n-type $Ga_{0.5}In_{0.5}P$ buffer layer may be provided on the abovementioned n-type GaAs buffer layer.

A etching stop layer may be provided between the flat portion 7a and the ridge portion 7b of the p-type cladding layer 7. Existence of the etching stop layer enables the ridge portion 7b to be formed by etching with the thickness of the flat portion 7a being maintained uniform.

The $(Al_xGa_{1-x})_uIn_{1-u}P$ ($x \geq 0$) crystals are accurately in lattice matching with the GaAs semiconductor substrate when u=0.51 and causes no strain, but if the composition ratio u of $(Al_xGa_{1-x})_uIn_{1-u}P$ is in the vicinity of 0.51, they causes almost no strain. Accordingly, in the crystals simply indicated as $(Al_xGa_{1-x})_{0.5}In_{0.5}P$, it is sufficient that the composition ratio u of the $(Al_xGa_{1-x})_uIn_{1-u}P$ is in the vicinity of 0.51. Also, though 0.7 is selected as the Al composition ratio of each cladding layer other than the barrier cladding layer, it is preferably selected appropriately in the range of about 0.5–0.8 from the reason stated in the description of the background art.

The band gap energy increases as the absolute value of the tensile strain is larger, but the critical film thickness (a film thickness with which considerable crystallin deterioration occurs in certain strain) becomes smaller if the absolute value of tensile strain is large. As to the barrier cladding layer, considering this, the thickness and the strain are appropriately selected so that its thickness is not smaller than the thickness allowing almost no transmission of electrons and smaller than the critical thickness, and its strain (a negative value in the case of tensile strain) is not less than about −2%.

Particularly, as shown in the fourth embodiment, the strain of the p-type barrier cladding layer is preferably not less than −1.5% and not more than −0.5%, more preferably not less than −1.2% and not more than −0.8%, further preferably not less than −1.1% and not more than −0.9%, and most preferably about −1%. Also, in the p-type barrier cladding layer formed of $(Al_zGa_{1-z})_uIn_{1-u}P$ ($1 \geq z > 0$, u>0.51), the composition ratio z is preferably not less than 0.7 and not more than 1, more preferably not less than 0.8 and not more than 1, and further preferably not less than 0.9 and not more than 1, and most preferably about 1.

Also, the thickness of the p-type barrier cladding layer formed of $(Al_zGa_{1-z})_uIn_{1-u}P$ ($1 \geq z > 0$, u>0.51) is a thickness which allows almost no transmission of electrons as described above, and more preferably a thickness allowing no transmission of electrons, and specifically, preferably about not less than 200 Å and not more than 500 Å, and more preferably about not less than 250 Å and not more than 400 Å.

Furthermore, the GaAs semiconductor substrate 1 has one main surface (crystal growth plane) misoriented from the (100) plane to the [011] direction in the first through fourth embodiments, and it is preferred that the GaAs semiconductor substrate 1 has one main surface in equivalent relation with it. Accordingly, one main surface of the GaAs semiconductor substrate may be a plane misoriented from the (100) plane to the [0-1-1] direction, a plane misoriented from the (010) plane to the [101] or [-10-1] direction, or a plane misoriented from the (001) plane to the [110] or [-1-10] direction, that is to say, it is satisfactory that it is a plane misoriented from the {100} plane to the <011> direction.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser device, comprising:
   a GaAs semiconductor substrate of one of a first conductivity type and a second conductivity type opposite to said first conductivity type;
   a first cladding layer on said GaAs semiconductor substrate of an AlGaInP system crystal of the same conductivity type as said substrate and having a lattice substantially matching the lattice of said GaAs semiconductor substrate;
   an active layer on said first cladding layer;
   a second cladding layer on said active layer of an AlGaInP system crystal, said second cladding layer being of a conductivity type opposite to the conductivity type of said substrate and having a lattice substantially matching the lattice of said GaAs semiconductor substrate; and
   a p-type barrier cladding layer in the one of said first and second cladding layers which is p-type and/or between said one cladding layer and said active layer of an AlGaInP system crystal or an AlInP system crystal,
   said p-type barrier cladding layer having a thickness to substantially block transmission of electrons therethrough, having tensile strain and also having band gap energy larger than that of said one cladding layer.

2. The semiconductor laser device according to claim 1, wherein said thickness of said p-type barrier cladding layer is between about 200 Å and about 500 Å.

3. The semiconductor laser device according to claim 2, wherein said thickness of said p-type barrier cladding layer is between about 250 Å A and about 400 Å.

4. The semiconductor laser device according to claim 1, wherein said p-type barrier cladding layer is of $(Al_zGa_{1-z})_u In_{1-u}P$, and $0.7 \leq z \leq 1$ and $0.51 < u < 1$.

5. The semiconductor laser device according to claim 4, wherein said p-type barrier cladding layer is of $(Al_zGa_{1-z})_u In_{1-u}P$, and $0.8 \leq z \leq 1$ and $0.51 < u < 1$.

6. The semiconductor laser device according to claim 5 wherein said p-type barrier cladding layer is of $(Al_zGa_{1-z})_u In_{1-u}P$, and $0.9 \leq z \leq 1$ and $0.51 < u < 1$.

7. The semiconductor laser device according to claim 1, wherein said p-type barrier cladding layer has a strain of between about −1.5% and about −0.5%.

8. The semiconductor laser device according to claim 7, wherein said p-type barrier cladding layer has a strain of between about −1.2% and about −0.8%.

9. The semiconductor laser device according to claim 8, wherein said p-type barrier cladding layer has a strain of between about −1.1% and about −0.9%.

10. The semiconductor laser device according to claim 1, wherein said GaAs semiconductor substrate has a crystal growth plane misoriented from the {100} plane to the <011> direction by between about 5 degrees and about 17 degrees.

11. The semiconductor laser device according to claim 1, further comprising:
    an n-type barrier cladding layer in the other of said first and second cladding layers and/or between said other cladding layer and said active layer, and formed of an AlGaInP system crystal or an AlInP system crystal;
    said n-type barrier cladding layer having a thickness to substantially block transmission of electrons therethrough, having tensile strain and having band gap energy larger than said other cladding layer.

12. The semiconductor laser device according to claim 1, wherein said active layer comprises a quantum well structure layer including quantum barrier layers of an AlGaInP system crystal and at least one quantum well layer of at least one of an AlGaInP system crystal and a GaInP system crystal alternately provided.

13. The semiconductor laser device according to claim 12, wherein said active layer further comprises optical guide layers on both sides of said quantum well structure layer.

14. The semiconductor laser device according to claim 1, wherein said active layer comprises a layer of an AlGaInP system crystal or a GaInP system crystal.

15. A semiconductor laser device, comprising:
    a GaAs semiconductor substrate of a first conductivity type;
    a first cladding layer formed on said GaAs semiconductor substrate and formed of an AlGaInP system crystal of the first conductivity type which has a lattice substantially matching the lattice of said GaAs semiconductor substrate;
    an active layer formed on said first cladding layer;
    a second cladding layer formed on said active layer as an AlGaInP system crystal of a second conductivity type which is opposite to said first conductivity type and having a lattice substantially matching the lattice of said GaAs semiconductor substrate; and
    a plurality of p-type barrier cladding layers provided separately from each other in the one of said first and second cladding layers which is p-type and/or between said p-type cladding layer and said active layer, and formed of an AlGaInP system crystal or an AlInP system crystal;
    each of said plurality of p-type barrier cladding layers having a thickness through which almost no electrons are transmitted, having tensile strain and also having a band gap energy larger than that of said p-type cladding layer.

16. The semiconductor laser device according to claim 15, wherein said plurality of p-type barrier cladding layers each have a refractive index, which indexes gradually decrease in the direction away from said active layer.

17. The semiconductor laser device according to claim 15, further comprising:
    a plurality of n-type barrier cladding layers provided separately from each other in the one of said first and second cladding layers which is n-type and/or between said n-type cladding layer and said active layer, and formed of an AlGaInP system crystal or an AlInP system crystal;
    each of said plurality of n-type barrier cladding layers having a thickness through which almost no electrons are transmitted, having tensile strain and having band gap energy larger than that of said n-type cladding layer.

18. The semiconductor laser device according to claim 17, wherein said plurality of p-type barrier cladding layers each have a refractive index, which indexes gradually decrease in the direction away from said active layer and said plurality of n-type barrier cladding layers each have a refractive index, which indexes gradually decrease in the direction away from said active layer.

19. The semiconductor laser device according to claim 18, wherein said plurality of p-type and n-type barrier cladding layers have refractive index distribution which is almost symmetric with respect to said active layer.

20. A semiconductor laser device comprising an n-type cladding layer, an active layer and a p-type cladding layer in this order, at least one p-type barrier cladding layer having a thickness to substantially block the transmission of electrons, tensile strain and band gap energy larger than said p-type cladding layer, said p-type barrier cladding layer provided in said p-type cladding layer and/or between said p-type cladding layer and said active layer.

21. A semiconductor laser device as in claim 1 wherein the said one of said first and second cladding layers with which said p-type barrier cladding layer is associated comprises a plurality of sub-layers and said p-type barrier cladding layer comprises sub-layers between said sub-layers of said one cladding layer.

* * * * *